(12) United States Patent
Wu et al.

(10) Patent No.: US 11,300,635 B2
(45) Date of Patent: Apr. 12, 2022

(54) METHOD FOR DETECTING PIN MISALIGNMENT IN IC HANDLING AND INSTALLATION AND SYSTEM FOR SAME

(71) Applicant: Shenzhen Fugui Precision Ind. Co., Ltd., Shenzhen (CN)

(72) Inventors: De-Zhong Wu, Shenzhen (CN); Zhi-Cheng Yu, Shenzhen (CN)

(73) Assignee: Shenzhen Fugui Precision Ind. Co., Ltd., Shenzhen (CN)

( * ) Notice: Subject to any disclaimer, the term of this patent is extended or adjusted under 35 U.S.C. 154(b) by 87 days.

(21) Appl. No.: 16/895,155

(22) Filed: Jun. 8, 2020

(65) Prior Publication Data
US 2021/0341549 A1 Nov. 4, 2021

(30) Foreign Application Priority Data
Apr. 29, 2020 (CN) .......................... 202010359077.3

(51) Int. Cl.
*G01R 31/66* (2020.01)
*G01L 5/00* (2006.01)

(52) U.S. Cl.
CPC ................ *G01R 31/66* (2020.01); *G01L 5/00* (2013.01)

(58) Field of Classification Search
CPC .................................. G01R 31/66; G01L 5/00
See application file for complete search history.

(56) References Cited

U.S. PATENT DOCUMENTS

| | | | |
|---|---|---|---|
| 8,838,408 B2 * | 9/2014 | Linde ................. | G01R 31/2891 702/150 |
| 2009/0315258 A1 * | 12/2009 | Wallace ................ | G06F 3/0443 273/238 |
| 2011/0012869 A1 * | 1/2011 | Klinghult .............. | G06F 1/3287 345/178 |
| 2013/0038336 A1 * | 2/2013 | Sun ........................ | G01R 35/00 324/601 |
| 2017/0177114 A1 * | 6/2017 | Frey ...................... | G06F 3/0445 |

FOREIGN PATENT DOCUMENTS

| | | |
|---|---|---|
| TW | 201307876 A1 | 2/2013 |
| TW | 201905668 A | 2/2019 |

\* cited by examiner

*Primary Examiner* — Akm Zakaria
(74) *Attorney, Agent, or Firm* — ScienBiziP, P.C.

(57) ABSTRACT

A method and system for detecting pin misalignment of ICs when being inserted into IC sockets includes a pressure sensing unit obtaining information as to pin insertion and pressure exerted by the pin and outputting the sensed information. A microprocessor receives the sensed information and obtains a pressure value correspondingly. Any misalignment of the pin is determined according to the pressure value so calculated.

8 Claims, 5 Drawing Sheets

METHOD FOR DETECTING PIN MISALIGNMENT IN IC HANDLING AND INSTALLATION AND SYSTEM FOR SAME

FIELD

The subject matter herein generally relates to IC handling.

BACKGROUND

The pin fixture of a pin insertion machine for IC sockets often fails to fix problem pins on the IC. defective products can be produced continuously, affecting production capacity and utilization rate. Current pin machines and pin detection technology do not detect the positions of IC pins at the time of insertion. The occurrence of regular deviations as defective conditions is often not recognized. However defective conditions as pin deviations account for about 70% of the failure rate in the actual manufacturing processes. Most misalignment conditions occur using machine vision for detection when misalignments are not previously recognized and cause poor utilization rates and low production.

Thus, there is room for improvement within the art.

BRIEF DESCRIPTION OF THE DRAWINGS

Implementations of the present technology will now be described, by way of embodiment, with reference to the attached figures, wherein.

DETAILED DESCRIPTION

Figure 1:
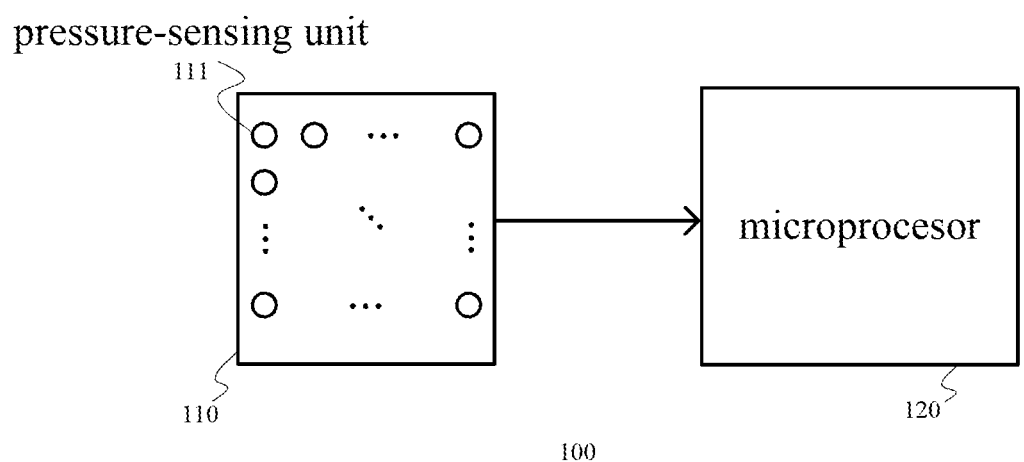
FIG. 1 is a block diagram of one embodiment of a detecting system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the disclosure.

Several definitions that apply throughout this disclosure will now be presented.

The term "coupled" is defined as connected, whether directly or indirectly through intervening components, and is not necessarily limited to physical connections. The connection may be such that the objects are permanently connected or releasably connected. The term "substantially" is defined to be essentially conforming to the particular dimension, shape, or other feature that the term modifies, such that the component need not be exact. The term "comprising," when utilized, is "including, but not necessarily limited to"; it specifically indicates open-ended inclusion or membership in the so-described combination, group, series, and the like. References to "an" or "one" embodiment in this disclosure are not necessarily to the same embodiment, and such references mean "at least one."

FIG. 1 illustrates an architecture of a system according to an embodiment of the disclosure. As shown in FIG. 1, a pin misalignment detecting system 100 includes a sensor 110, a pressure-sensing unit 111, and a microprocessor 120. In this embodiment, the sensor 110 is configured with a matrix of 53×42 pressure-sensing units 111, as an example. In another embodiment, the arrangement of the pressure-sensing units 111 in the sensor 110 may have another matrix size. The area of the matrix composed of the pressure sensing units 111 is at least equal to the area of the IC socket to be tested. In actual operation, a pin is inserted into the integrated circuit socket through a pin machine. The pin misalignment detecting system is set parallel to the pin machine. Under normal circumstances, the pin is inserted into the integrated circuit socket and contacts the sensor 110. A pressure-sensing unit 111 corresponds to each pin which is inserted into the socket of the integrated circuit to be tested. The positions of the pin contacts can be detected by the pressure-sensing unit 111. The integrated circuit socket may be irregularly distributed according to the actual needs of the product, or the user can set the matrix range of the pressure-sensing unit 111 according to the actual situation.

The sensor 110 includes at least one pressure-sensing unit 111. The pressure-sensing unit 111 includes an elastomer thin film pressure distributed sensor. In one embodiment, the sensor 110 includes a plurality of pressure-sensing units 111. The pressure-sensing units 111 are arranged as a matrix and sense the pin insertion. Information as to the insertion and pressure is transmitted to the microprocessor 120 by the sensor 110. The microprocessor 120 receives the information and calculates a value of pressure on each pressure-sensing unit 111 according to the information. The information and the corresponding pressure value obtained from the pressure-sensing unit 111 are recorded as historical data by the microprocessor 120. A reference model or models is established by statistical calculations based on the historical data.

In the embodiment, each pressure-sensing unit 111 can be divided into multiple areas. Different force sensitivity coefficients are configured in different areas. In this embodiment, the pressure-sensing unit 111 comprises a central area, a right area, an upper area, a left area, and a lower area. The different force sensitivity coefficients cause differences in the information generated when the pin touches the different areas. In this way, the pressure value is obtained according to the sensed insertion and pressure to determine the area where the pin is in contact. Furthermore, a determination can be made as to whether the pin is touching the central area of a pressure-sensing unit 111 or whether there is a misalignment of the pin. The detection result can be displayed on a visual interface according to the area of the pressure-sensing unit 111 where the pin actually touches. The different areas where the pin may be touching can be displayed in different colors to provide a user with a quick understanding of the pin status.

Figure 2:
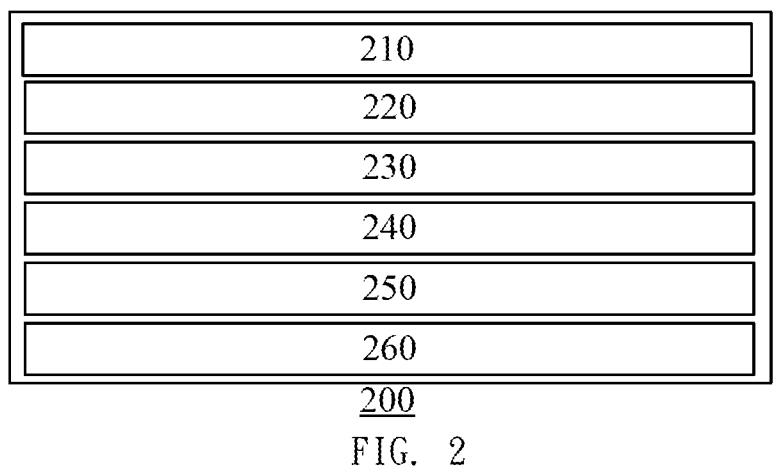
FIG. 2 is a cross-section of one embodiment of a pressure sensing unit.

FIG. 2 illustrates a cross-section of a pressure-sensing unit according to an embodiment of the disclosure. As shown in FIG. 2, the pressure-sensing unit 200 further comprises an elastomer layer 210, an upper layer of printed electrode substrate 220, a first insulating layer 230, a force sensitive layer 240, a second insulating layer 250, and a lower layer of printed electrode substrate 260. The force sensitive layer 240 can be provided with different force sensitivity coefficients in different areas. The first insulating layer 230 and the second insulating layer 250 insulate the force sensitive layer 240 from the upper layer 220 of the printed electrode substrate and the lower layer 260 of the printed electrode substrate. The upper layer 220 and the lower layer 260 of the printed electrode substrate encapsulate the pressure sensing unit 200. The pressure-sensing unit 200 is equivalent to a variable force sensitive resistor. The elastomer layer 210 has elasticity characteristics and can sense pressure without permanent deformation and repeated use.

Figure 3:
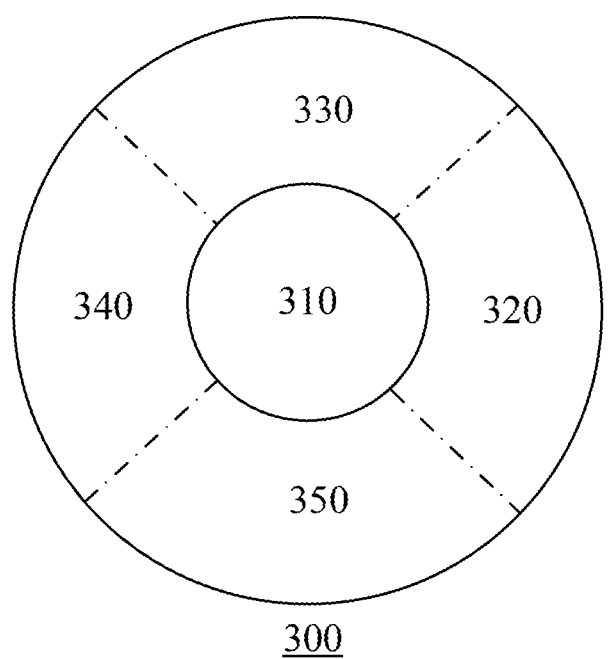
FIG. 3 is a schematic diagram of one embodiment of a force sensitive coefficient being set on the force sensitive layer of the pressure sensing unit.

FIG. 3 illustrates setting a force sensitive coefficient of the force sensitive layer in the pressure-sensing unit according to an embodiment of the disclosure. As shown in FIG. 3, the force sensitive coefficient setting of the force sensitive layer 300 is divided into a central area 310, a right area 320, an upper area 330, a left area 340, and a lower area 350. It should be noted that the disclosed shape and distribution of the area of the force sensitive layer 300 shown in FIG. 3 are not to limit the present invention. The different force sensitive coefficients are set in different areas of the force sensitive layer 300. The area where a pin touches the pressure-sensing unit is determined according to different resistance values of the pins contacting the pressure-sensing unit. The areas where the pins touch are determined according to pressure values and pin misalignments are determined according to the same areas. For example, there is not a pin misalignment occurred when the pin touches the central area. There is the pin misalignment when the pin is not touching the central area. In this embodiment, the force sensitivity coefficient of the central area 310 is set to 1.0, the remaining areas decrease in order. The force sensitivity coefficient of the right area 320 is set to 0.9. The force sensitivity coefficient of the upper area 330 is set to 0.8. The force sensitivity coefficient of the left area 340 is set to 0.7. The force sensitivity coefficient of the lower area 350 is set to 0.6. The pressure value of the pressure-sensing unit will be correspondingly changed in different areas of the force sensitive layer. The resistance value of the pressure-sensing unit will change accordingly. The central area indicates the greatest pressure. The other areas indicate a decrease in pressure according to the force sensitivity coefficients. Therefore, the information is obtained by sensing the pin which is touching the pressure-sensing unit, the pressure value is obtained by the information, and the area where the pin is exerting a force in the force sensitive layer is determined according to the pressure value. The force sensitivity coefficients in each area in this embodiment are only examples and are not limited to the force sensitivity coefficients above. It is only necessary to divide the pressure sensitive layer of the pressure-sensing unit into different areas which each has a different force sensitivity coefficient.

Figure 4:
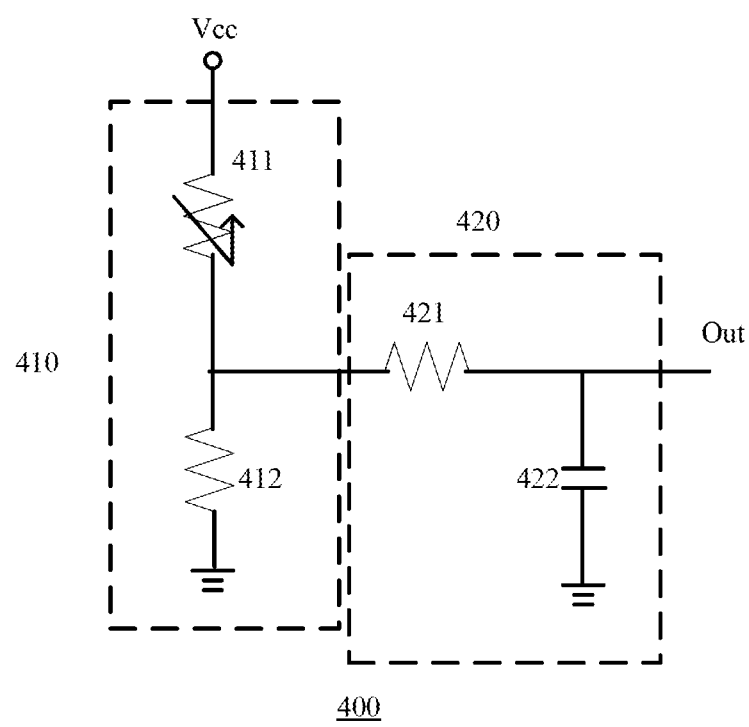
FIG. 4 is a circuit diagram of one embodiment of the pressure sensing unit.

FIG. 4 illustrates a resistance detection circuit diagram of the pressure-sensing unit according to an embodiment of the disclosure. As shown in FIG. 4, the resistance detection circuit 400 in the pressure-sensing unit can obtain the pressure value by detecting a resistance value. The resistance detection circuit 400 comprises a pressure-sensing circuit 410, and a filter circuit 420. The pressure-sensing circuit 410 comprises a variable resistor 411 and a first resistor 412. The filter circuit 420 comprises a second resistor 421 and a first capacitor 422. The variable resistor 411 is shown by formula (1) following:

$$R\text{-sensor} = R1 * Vcc/(Vout-1)) \quad (1)$$

R-sensor in formula (1) is the variable resistor 411, R1 is the first resistor 412, Vout is an output voltage. The microprocessor calculates a correspondence between the pin contact pressure and the variable resistance according to the resistance value calculated by the formula (1). The degree of pressure sensed by the pressure-sensing circuit 410 is known by detecting variable resistance. In one embodiment, the thickness of the pressure-sensing unit is 0.3 mm. The resistance is basically unchanged, and the pressure value is 0 when the vertical distance of the pin from the pressure-sensing unit exceeds 0.3 mm.

The filter circuit 420 is composed of the second resistor 421 and the first capacitor 422. The filter circuit 420 is disposed between the pressure-sensing circuit 410 and a positive input of an amplifier 450. In this embodiment, a power supply 430 provides a 3.3V voltage, the first resistor 412 is 10 k ohms, the second resistor 441 is 10 ohms, and the first capacitor 442 is 100 picofarad (pF).

Figure 5:
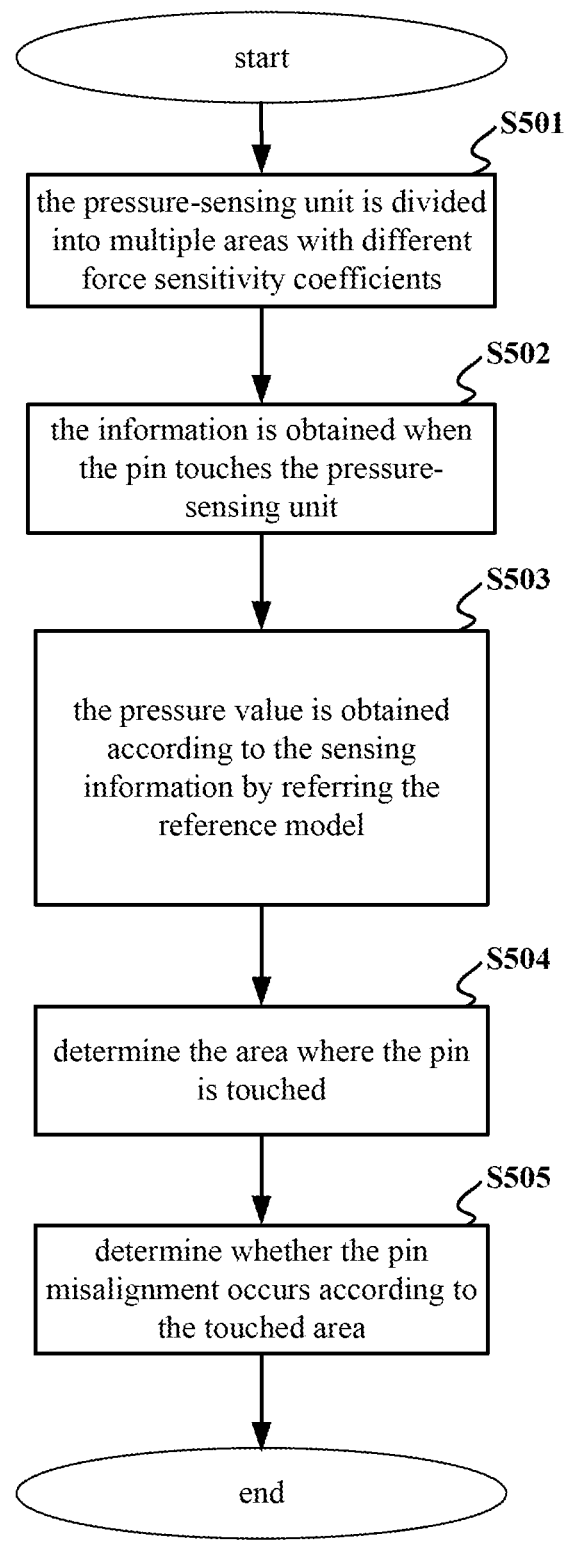
FIG. 5 is a flowchart of one embodiment of a method for detecting pin misalignments.

FIG. 5 illustrates a flowchart of a method of detecting pin misalignment according to an embodiment of the disclosure. Before the steps are executed, a detection system is built, and the reference model corresponding to the pressure and the information are loaded. For example, the relationship between the pressure value is measured each time and the variable resistance value is recorded. The reference model between the sensing information and the pressure value is established by the historical data of multiple measurements. Based on the reference model, the pressure value which is obtained when a pin touches a central area is regarded as a normal value. Pressure values other than normal are obtained when the pin touches on other areas. It obtains different pressure values corresponding to different areas when there is pin misalignment.

In step S501, the pressure-sensing unit is divided into multiple areas with different force sensitivity coefficients. In step S502, the information is obtained when the pin touches the pressure-sensing unit. In step S503, the pressure value is obtained according to the information by referring to the reference model. In step S504, determine the area where the pin is touched. In step S505, determine whether the pin misalignment occurs according to the touched area.

The above description is for the detection process of a single pin. However, there may be plurality integrated circuit sockets and arrange in irregular. Users can set their own detecting range according to the actual shape of the integrated circuit and sockets number.

In one embodiment, the pin insertion of the integrated circuit sockets can be operated in separate rows. Users can define an alarm limit for the numbers the point of misalignment. A notification is sent to an administrator when the number of the pin misalignment exceeds the alarm limit. The location of the pin and the number of the pin misalignment are recorded when the number of the pin misalignment does not exceed the alarm limit. The count of the numbers of the pin misalignment will plus one. The next row of the pin insertion will execute when the pressure value is normal. The areas of the pin touches the pressure-sensing unit can show in different colors in a graphical user interface after the pin insertion finished. The distribution of the areas of the pressure-sensing unit as shown in FIG. 3, the graphical user interface shows in blue color when the pin is touched the central area of the pressure-sensing unit. The graphical user interface shows in green (yellow, purple, and orange) colors when the pin touches the right area (left area, upper area, and lower area) of the pressure-sensing unit. The graphical user interface shows in red color when the pin is not touched to the pressure-sensing unit. In one embodiment, users can self define the number or the shape of the areas of the pressure-sensing. For example, the pressure-sensing unit can be divided into two areas (upper and lower areas, left and right areas, or two areas of the inner and outer circle of the concentric circles. The pressure-sensing unit can be divided into five areas (central area, upper area, lower area, left area and right area). The count numbers of the good product of the integrated circuit socket insertion will plus by one when the pressure value of the pin touches on the pressure-sensing unit is normal. The status of the pin insertion to the integrated circuit socket shows to the user immediately and intuitively by the visualization interface.

The embodiments shown and described above are only examples. Therefore, many details of such art are neither shown nor described. Even though numerous characteristics and advantages of the technology have been set forth in the foregoing description, together with details of the structure and function of the disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A method for detecting pin misalignment, the method comprising:
    dividing a pressure-sensing unit into multiple areas with different force sensitivity coefficients, the multiple areas comprising a central area, a right area, an upper area, a left area, and a lower area corresponding to different force sensitivity coefficients; the right area, the upper area, the left area, and the lower area surrounding the central area;
    obtaining information when a pin touches the pressure-sensing unit;
    comparing the information and reference information corresponding to a reference model of pressure and the reference information to obtain a pressure value corresponding to the information;
    determining a touched area where the pin touches according to the pressure value, and
    determining whether a pin misalignment occurs according to the touched area, and displaying different colors when the pin touches the central area, the right area, the upper area, the left area, or the lower area.

2. The method of claim 1, wherein the pressure-sensing unit further comprises an elastomer layer, an upper layer of printed electrode substrate, a first insulating layer, a force sensitive layer, a second insulating layer and a lower layer of printed electrode substrate.

3. The method of claim 1, further comprising:
    obtaining a standard value of the pressure value according to the information generated when the pin touches the central area.

4. The method of claim 3, wherein determining the touched area where the pin touches according to the pressure value, and determining whether the pin misalignment occurs according to the touched area further comprising:
    determining that the pin touches the central area when the pressure value is equal to the standard value;
    determining that the pin misalignment occurs when the pressure value is not equal to the standard value.

5. A system for detecting pin misalignment, comprising:
    a sensor comprising at least a pressure-sensing unit which obtains information when a pin touches the pressure-sensing unit;
    the pressure-sensing unit divided into multiple areas with different force sensitivity coefficients, the multiple areas comprising a central area, a right area, an upper area, a left area, and a lower area corresponding to different force sensitivity coefficients; the right area, the upper area, the left area, and the lower area surrounding the central area;
    a microprocessor receiving the information and comparing the information with reference information corresponding to a reference model of pressure and the reference information to obtain a pressure value corresponding to the information;
    the microprocessor determining a touched area where the pin touches according to the pressure value and determining whether a pin misalignment occurs according to the touched area, and displaying different colors when the pin touches the central area, the right area, the upper area, the left area, or the lower area.

6. The system of claim 5, wherein the pressure-sensing unit further comprises an elastomer layer, an upper layer of printed electrode substrate, a first insulating layer, a force sensitive layer, a second insulating layer and a lower layer of printed electrode substrate.

7. The system of claim 5, further comprising:
    obtaining a standard value of the pressure value according to the information generated when the pin touches the central area.

8. The system of claim 7, wherein determining the touched area where the pin touches according to the pressure value, and determining whether the pin misalignment occurs according to the touched area further comprising:
    determining that the pin touches the central area when the pressure value is equal to the standard value;
    determining that the pin misalignment occurs when the pressure value is not equal to the standard value.

* * * * *